United States Patent
Shida et al.

[11] Patent Number: 5,968,201
[45] Date of Patent: Oct. 19, 1999

[54] METHOD AND APPARATUS FOR ERROR CORRECTION

[75] Inventors: Kazuo Shida; Mitsuru Uesugi, both of Yokohama, Japan

[73] Assignee: Matsushita Electric Industrial Co., Ltd., Osaka, Japan

[21] Appl. No.: 08/834,838

[22] Filed: Apr. 10, 1997

[30] Foreign Application Priority Data

Apr. 19, 1996 [JP] Japan ................................... 8-098469

[51] Int. Cl.$^6$ ........................... G06F 11/10; H03M 13/12
[52] U.S. Cl. ........................... 714/795; 714/786; 714/746
[58] Field of Search .................. 371/43.7, 43.1, 371/30; 714/795, 786, 746

[56] References Cited

FOREIGN PATENT DOCUMENTS

1209827  8/1989  Japan .
3286623  12/1991  Japan .

*Primary Examiner*—Phung M. Chung
*Attorney, Agent, or Firm*—Pollock, Vande Sande & Amernick

[57] ABSTRACT

Received data representing voice information is subjected to Viterbi decoding to correct an error in the received data. Thereby, the received data is decoded into second data. A path metric is calculated to determine the second data during the Viterbi decoding. A decision is made as to whether or not at least one error is present in the second data by referring to a cyclic redundancy check code in the second data. The second data is discarded when it is decided that at least one error is present in the second data. A decision is made as to whether or not the calculated path metric exceeds a threshold value. The second data is discarded when it is decided that the path metric exceeds the threshold value. The second data is converted into sound when it is decided that at least one error is not present in the second data and that the path metric does not exceed the threshold value.

12 Claims, 7 Drawing Sheets

METHOD AND APPARATUS FOR ERROR CORRECTION

BACKGROUND OF THE INVENTION

1. Field of the Invention

This invention relates to a method of data processing which includes error correction in, for example, digital communications. This invention also relates to an apparatus for data processing which includes error correction.

2. Description of the Related Art

It is known to use a CRC (cyclic redundancy check) code in detection of errors in data. According to some data communication formats, a stream of data representing voice information or audio information is divided into frames, and the data is transmitted frame by frame.

In the transmitter side of a known voice-data communication system, "m" bits of CRC code words (that is, error detection code words) are added to every "k" bits of first data representing voice information, so that the first data is converted to second data. Then, error correction code words are added to every "k+m" bits of the second data, and thereby the second data is converted to third data. The third data is transmitted frame by frame. Every frame of the third data contains "k+m" bits of the second data and the corresponding error correction code words.

Japanese published unexamined patent application 3-286623 discloses a sequence of processes implemented by a voice-data receiver side. In Japanese application 3-286623, received data is processed frame by frame. Specifically, every frame of the received data is subjected to a decoding process in response to error correction code words. An error or errors in every frame of the received data can be detected in the decoding process. If an error or errors in the present frame of the received data are detected in the decoding process, the present frame of the received data is discarded. In this case, the present frame of new data is generated by interpolation using the previous frame of the received data, or the present frame of muting data is generated. The present frame of the new data or the muting data is used by a voice recovering process. On the other hand, if any error in the present frame of the received data is not detected in the decoding process, the present frame of the decoding-resultant data is subjected to error detection using CRC code words. If an error or errors in the present frame of the decoding-resultant data are detected during the error detection, the present frame of the decoding-resultant data is discarded. In this case, the present frame of new data is generated by interpolation using the previous frame of the decoding-resultant data, or the present frame of muting data is generated. The present frame of the new data or the muting data is used by the voice recovering process. On the other hand, if any error in the present frame of the decoding-resultant data is not detected during the error detection, the present frame of the decoding-resultant data is used by the voice recovering process. The present frame of the new data, the muting data, or the decoding-resultant data is converted by the voice recovering process into original voice used as output voice.

Generally, some of errors in data can not be sensed by typical error detection using CRC code words. Accordingly, such errors tend to remain in the data converted into output voice. These errors cause noise in the output voice.

SUMMARY OF THE INVENTION

It is a first object of this invention to provide an improved method of data processing which includes error correction.

It is a second object of this invention to provide an improved apparatus for data processing which includes error correction.

A first aspect of this invention provides a method comprising the steps of a) subjecting received data to Viterbi decoding to correct an error in the received data and thereby decoding the received data into second data, and calculating a path metric to determine the second data during the Viterbi decoding; b) deciding whether or not at least one error is present in the second data by referring to a cyclic redundancy check code in the second data; c) discarding the second data when the step b) decides that at least one error is present in the second data; d) deciding whether or not the path metric calculated by the step a) exceeds a threshold value; e) discarding the second data when the step d) decides that the path metric exceeds the threshold value; and f) converting the second data into sound when the step b) decides that at least one error is not present in the second data and the step d) decides that the path metric does not exceed the threshold value.

A second aspect of this invention is based on the first aspect thereof, and provides a method further comprising the steps of g) calculating a likelihood of the received data; h) deciding whether or not the likelihood calculated by the step g) is smaller than a reference value; and i) discarding the second data when the step h) decides that the likelihood is smaller than the reference value; wherein the step f) comprises converting the second data into sound when the step b) decides that at least one error is not present in the second data, the step d) decides that the path metric does not exceed the threshold value, and the step h) decides that the likelihood is not smaller than the reference value.

A third aspect of this invention is based on the second aspect thereof, and provides a method further comprising the steps of j) adjusting the threshold value; and k) adjusting the reference value.

A fourth aspect of this invention is based on the second aspect thereof, and provides a method wherein the threshold value and the reference value comprise a predetermined threshold value and a predetermined reference value respectively.

A fifth aspect of this invention provides a method comprising the steps of a) calculating a likelihood of received data; b) deciding whether or not the likelihood calculated by the step a) is smaller than a reference value; c) discarding the received data when the step b) decides that the likelihood is smaller than the reference value; d) deciding whether or not at least one error is present in the received data by referring to a cyclic redundancy check code in the received data; e) discarding the received data when the step d) decides that at least one error is present in the received data; and f) converting the received data into sound when the step b) decides that the likelihood is not smaller than the reference value and the step d) decides that at least one error is not present in the received data.

A sixth aspect of this invention provides a method comprising the steps of a) calculating a likelihood of received data; b) subjecting the received data to Viterbi decoding to correct an error in the received data and thereby decoding the received data into second data, and calculating a path metric to determine the second data during the Viterbi decoding; c) deciding whether or not at least one error is present in the second data by referring to a cyclic redundancy check code in the second data; d) discarding the second data when the step c) decides that at least one error is present in the second data; e) deciding whether or not a set of the likelihood calculated by the step a) and the path metric calculated by the step b) is in a predetermined range within a 2-dimensional likelihood/path-metric plane; f) discarding the second data when the step e) decides that the set of the likelihood and the path metric is in the predetermined range; and g) converting the second data into sound when the step c) decides that at least one error is not present in the second data and the step e) decides that the set of the likelihood and the path metric is not in the predetermined range.

A seventh aspect of this invention provides an apparatus comprising first means for subjecting received data to Viterbi decoding to correct an error in the received data and thereby decoding the received data into second data, and for calculating a path metric to determine the second data during the Viterbi decoding; second means for deciding whether or not at least one error is present in the second data by referring to a cyclic redundancy check code in the second data; third means for discarding the second data when the second means decides that at least one error is present in the second data; fourth means for deciding whether or not the path metric calculated by the first means exceeds a threshold value; fifth means for discarding the second data when the fourth means decides that the path metric exceeds the threshold value; and sixth means for converting the second data into sound when the second means decides that at least one error is not present in the second data and the fourth means decides that the path metric does not exceed the threshold value.

An eighth aspect of this invention is based on the seventh aspect thereof, and provides an apparatus further comprising seventh means for calculating a likelihood of the received data; eighth means for deciding whether or not the likelihood calculated by the seventh means is smaller than a reference value; and ninth means for discarding the second data when the eighth means decides that the likelihood is smaller than the reference value; wherein the sixth means comprises means for converting the second data into sound when the second means decides that at least one error is not present in the second data, the fourth means decides that the path metric does not exceed the threshold value, and the eighth means decides that the likelihood is not smaller than the reference value.

A ninth aspect of this invention is based on the eighth aspect thereof, and provides an apparatus further comprising tenth means for adjusting the threshold value; and eleventh means for adjusting the reference value.

A tenth aspect of this invention is based on the eighth aspect thereof, and provides an apparatus wherein the threshold value and the reference value comprise a predetermined threshold value and a predetermined reference value respectively.

An eleventh aspect of this invention provides an apparatus comprising first means for calculating a likelihood of received data; second means for deciding whether or not the likelihood calculated by the first means is smaller than a reference value; third means for discarding the received data when the second means decides that the likelihood is smaller than the reference value; fourth means for deciding whether or not at least one error is present in the received data by referring to a cyclic redundancy check code in the received data; fifth means for discarding the received data when the fourth means decides that at least one error is present in the received data; and sixth means for converting the received data into sound when the second means decides that the likelihood is not smaller than the reference value and the fourth means decides that at least one error is not present in the received data.

A twelfth aspect of this invention provides an apparatus comprising first means for calculating a likelihood of received data; second means for subjecting the received data to Viterbi decoding to correct an error in the received data and thereby decoding the received data into second data, and for calculating a path metric to determine the second data during the Viterbi decoding; third means for deciding whether or not at least one error is present in the second data by referring to a cyclic redundancy check code in the second data; fourth means for discarding the second data when the third means decides that at least one error is present in the second data; fifth means for deciding whether or not a set of the likelihood calculated by the first means and the path metric calculated by the second means is in a predetermined range within a 2-dimensional likelihood/path-metric plane; sixth means for discarding the second data when the fifth means decides that the set of the likelihood and the path metric is in the predetermined range; and seventh means for converting the second data into sound when the third means decides that at least one error is not present in the second data and the fifth means decides that the set of the likelihood and the path metric is not in the predetermined range.

DESCRIPTION OF THE PREFERRED EMBODIMENTS

First Embodiment

Figure 1:
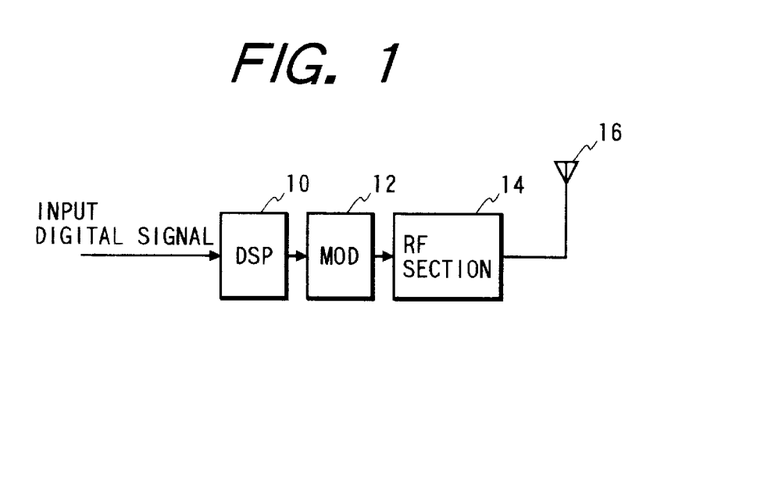
FIG. 1 is a block diagram of a transmitter in a base station according to a first embodiment of this invention.

With reference to FIG. 1, a transmitter in a base station includes a digital signal processor (DSP) 10, a modulator 12, an RF (radio frequency) section 14, and an antenna 16. The digital signal processor 10 is successively followed by the modulator 12, the RF section 14, and the antenna 16.

An input digital audio signal representing voice or speech is fed to the digital signal processor 10. The input digital audio signal is encoded by the digital signal processor 10 into encoding-resultant data of a predetermined format. The encoding-resultant data has a sequence of frames. In other words, the encoding-resultant data is divided into frames which are sequentially arranged along a time base.

The encoding-resultant data is outputted from the digital signal processor 10 to the modulator 12. The encoding-resultant data is subjected to predetermined digital modulation by the modulator 12 so that the encoding-resultant data is converted into a modulation-resultant baseband signal.

The modulation-resultant baseband signal is outputted from the modulator 12 to the RF section 14. The modulation-resultant baseband signal is converted into a first RF signal by an RF modulator in the RF section 14. The first RF signal is amplified into a second RF signal by an RF power amplifier in the RF section 14. The second RF signal is fed from the RF section 14 to the antenna 16. The second RF signal is radiated by the antenna 16.

The digital signal processor 10 includes a combination of an interface, a processing section, a ROM (read-only memory), and a RAM (random access memory). The digital signal processor 10 operates in accordance with a control program stored in the ROM. The digital signal processor 10 may be replaced by a computer, a microprocessor, or another similar device.

Figure 2:
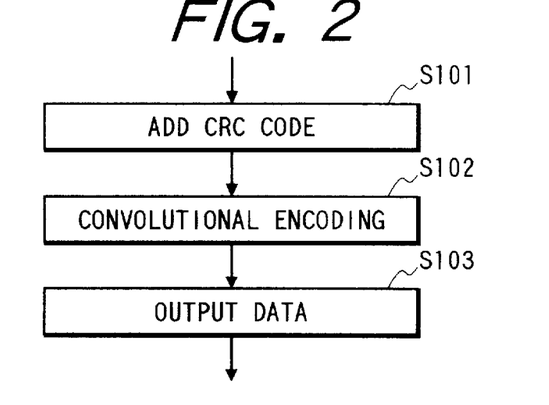
FIG. 2 is a flowchart of a segment of a control program for a digital signal processor in FIG. 1.

FIG. 2 is a flowchart of a segment of the control program for the digital signal processor 10 which is executed for every frame.

With reference to FIG. 2, a first step S101 in the program segment adds "m" bits of CRC code words (that is, error detection code words) to every "k" bits of the input digital audio signal, where "m" and "k" denote predetermined natural numbers respectively. Thus, the input digital audio signal is encoded into a second digital audio signal.

A step S102 following the step S101 subjects the second digital audio signal to convolutional encoding, that is, error-correction encoding. The step S102 encodes the second digital audio signal into a third digital audio signal of a predetermined convolutional code. The third digital audio signal is transmitted frame by frame. Every frame of the third digital audio signal contains information corresponding to "k+m" bits of the second digital audio signal and also added error-correcting information.

A step S103 following the step S102 outputs a current frame of the third digital audio signal to the modulator 12 (see FIG. 1). After the step S103, the program advances to a next step (not shown).

Figure 3:
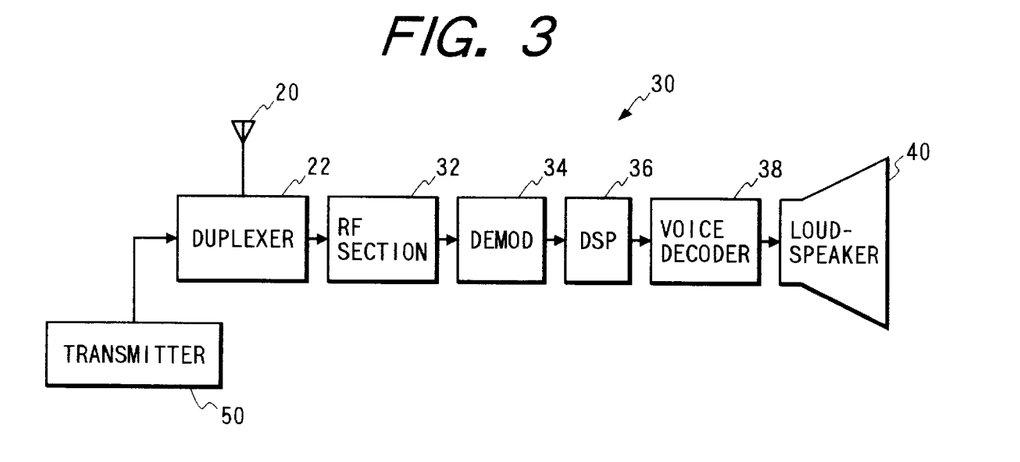
FIG. 3 is a block diagram of a mobile station according to the first embodiment of this invention.

With reference to FIG. 3, a mobile station includes an antenna 20, a duplexer 22, a receiver 30, and a transmitter 50. The duplexer 22 is connected to the antenna 20. The receiver 30 and the transmitter 50 are connected to the duplexer 22.

An RF signal transmitted from a base station, for example, the base station of FIG. 1, is received by the antenna 20. The received RF signal is fed from the antenna 20 to the receiver 30 via the duplexer 22.

The transmitter 50 feeds an RF signal to the antenna 20 via the duplexer 22. The RF signal is radiated by the antenna 20.

The receiver 30 includes an RF section 32, a demodulator 34, a digital signal processor (DSP) 36, a voice decoder 38, and a loudspeaker 40. The RF section 32 is connected to the duplexer 22. The RF section 32 is successively followed by the demodulator 34, the digital signal processor 36, the voice decoder 38, and the loudspeaker 40.

The received RF signal travels from the duplexer 22 to the RF section 32. The received RF signal is converted into a digital baseband signal by an RF demodulator in the RF section 32. The baseband signal is outputted from the RF section 32 to the demodulator 34. The baseband signal is subjected to digital demodulation by the demodulator 34 so that the baseband signal is converted into a first digital audio signal.

The first digital audio signal is outputted from the demodulator 34 to the digital signal processor 36. The first digital audio signal is decoded by the digital signal processor 36 into a second digital audio signal.

The second digital audio signal is outputted from the digital signal processor 36 to the voice decoder 38. The second digital audio signal is converted into an analog audio signal by a digital-to-analog converter in the voice decoder 38. The analog audio signal is fed from the voice decoder 38 to the loudspeaker 40, being converted into sound thereby.

The digital signal processor 36 includes a combination of an interface, a processing section, a ROM (read-only memory), and a RAM (random access memory). The digital signal processor 36 operates in accordance with a control program stored in the ROM. The digital signal processor 36 may be replaced by a computer, a microprocessor, or another similar device.

Figure 4:
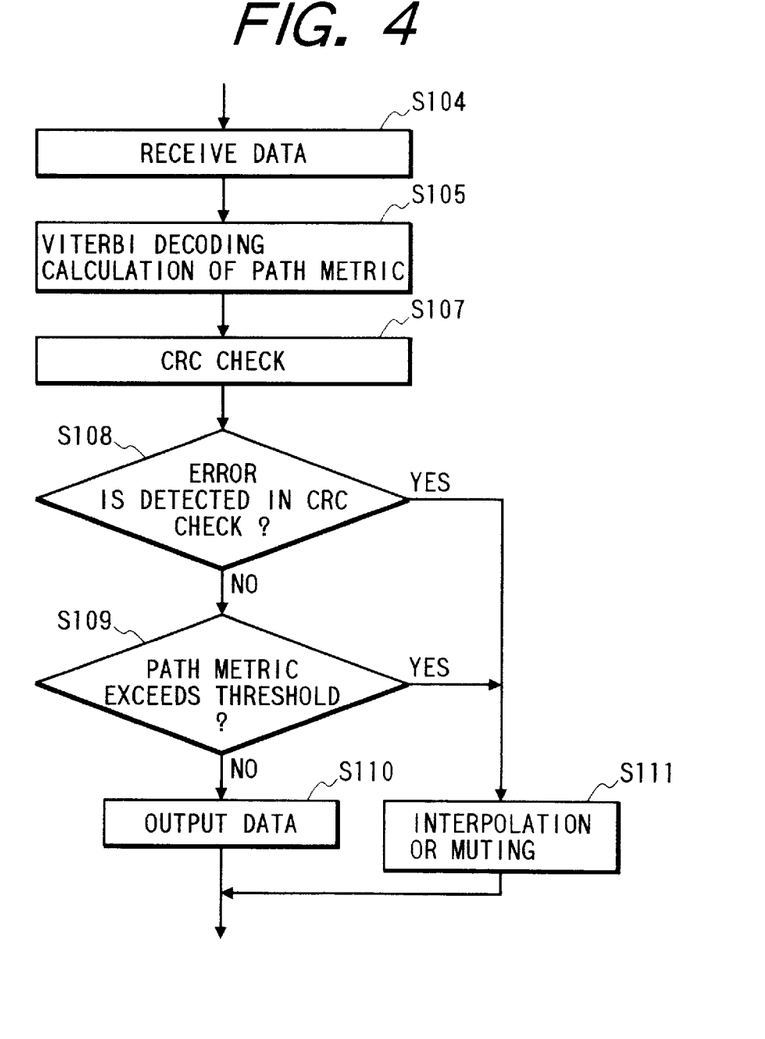
FIG. 4 is a flowchart of a segment of a control program for a digital signal processor in FIG. 3.

FIG. 4 is a flowchart of a segment of the control program for the digital signal processor 36 which is executed for every frame.

With reference to FIG. 4, a first step S104 in the program segment receives a current frame of data, that is, a current frame of a digital audio signal, from the demodulator 34 (see FIG. 3).

A step S105 following the step S104 subjects the current frame of the received data to Viterbi decoding which is opposite to convolutional encoding in a transmitter. The Viterbi decoding has an error correcting function by which an error or errors in the frame of the received data can be corrected. Thus, the step S105 decodes the received data into second data. During the Viterbi decoding, path metrics are calculated, and the smallest path metric is selected from among the calculated path metrics. The second data is determined by the smallest path metric.

A step S107 subsequent to the step S105 subjects a current frame of the second data to error detection using CRC code words therein.

A step S108 following the step S107 decides whether or not at least one error of the second data is detected during the error detection by the step S107. If at least one error of the second data is detected during the error detection, the program advances from the step S107 to a step S111. Otherwise, the program advances from the step S107 to a step S109.

The step S109 decides whether or not the smallest path metric available in the step S105 exceeds a predetermined threshold value. When the smallest path metric exceeds the predetermined threshold value, the program advances from the step S109 to the step S111. Otherwise, the program advances from the step S109 to a step S110. It should be noted that the received data is more erroneous as the smallest path metric increases.

The step S110 outputs the current frame of the second data to the voice decoder 38 (see FIG. 3). Thus, in this case, audio information represented by the current frame of the second data is converted into sound by the loudspeaker 40 (see FIG. 3).

The step S111 generates a current frame of new data by interpolation using the immediately-preceding frame of the second data. The step S111 outputs the current frame of the new data to the voice decoder 38 (see FIG. 3). Thus, in this case, audio information represented by the immediately-preceding frame of the second data is converted into sound by the loudspeaker 40 (see FIG. 3) instead of audio information represented by the current frame of the second data.

Alternatively, the step S111 may generate a current frame of muting data and output the current frame of the muting data to the voice decoder 38 (see FIG. 3). Thus, in this case, the loudspeaker 40 (see FIG. 3) is muted in response to the muting data.

The steps S110 and S111 are followed by a subsequent step (not shown).

The steps S108, S109, and S111 cooperate to effectively prevent audio noise from being generated by the loudspeaker 40 (see FIG. 3) due to errors in the received data.

Second Embodiment

Figure 5:
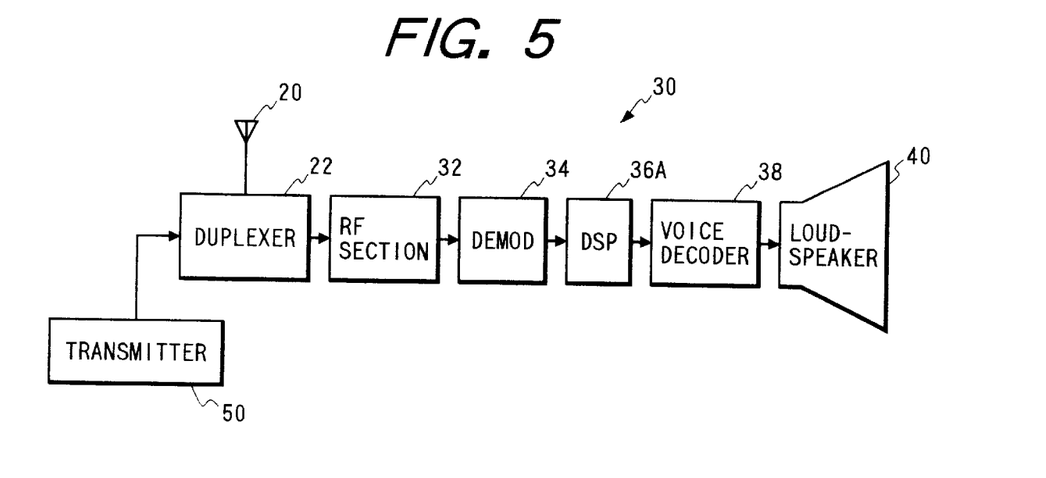
FIG. 5 is a block diagram of a mobile station according to a second embodiment of this invention.

A second embodiment of this invention is similar to the first embodiment thereof except for design changes indicated later. FIG. 5 shows a mobile station in the second embodiment of this invention. The mobile station in FIG. 5 includes a digital signal processor (DSP) 36A instead of the digital signal processor 36 in FIG. 3.

Figure 6:
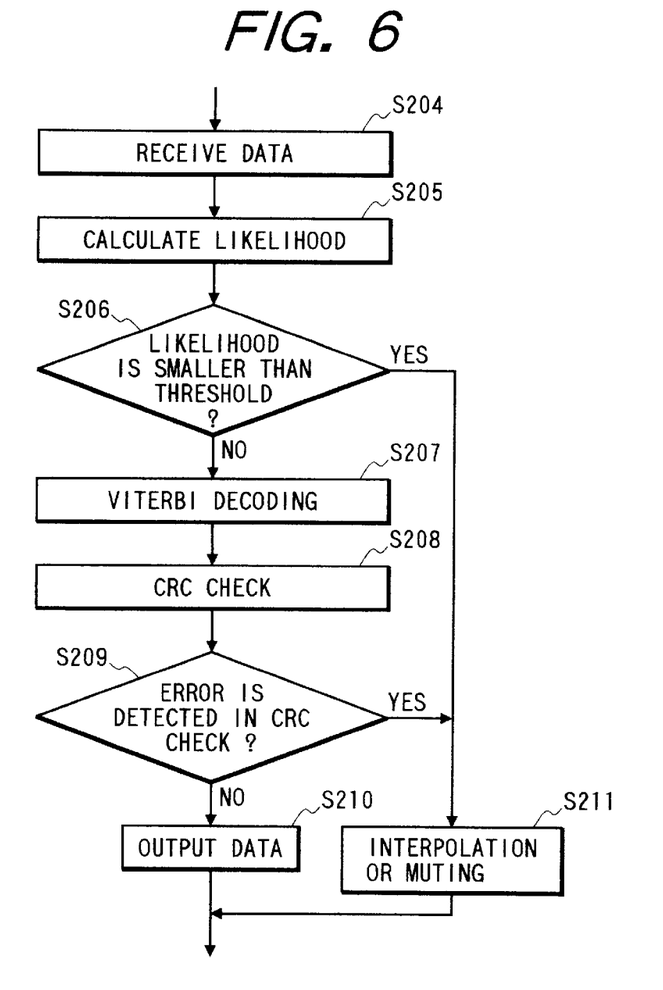
FIG. 6 is a flowchart of a segment of a control program for a digital signal processor in FIG. 5.

FIG. 6 is a flowchart of a segment of a control program for the digital signal processor 36A which is executed for every frame.

With reference to FIG. 6, a first step S204 in the program segment receives a current frame of data, that is, a current frame of a digital audio signal, from a demodulator 34 (see FIG. 5).

A step S205 following the step S204 calculates a likelihood of the current frame of the received data in a know way.

A step S206 subsequent to the step S205 decides whether or not the likelihood calculated by the step S205 is smaller than a predetermined threshold value. When the calculated likelihood is smaller than the predetermined threshold value, the program advances from the step S206 to a step S211. Otherwise, the program advances from the step S206 to a step S207. It should be noted that the received data is more erroneous as the likelihood decreases.

The step S207 subjects the current frame of the received data to Viterbi decoding which is opposite to convolutional encoding in a transmitter. The Viterbi decoding has an error correcting function by which an error or errors in the frame of the received data can be corrected. Thus, the step S207 decodes the received data into second data.

A step S208 subsequent to the step S207 subjects a current frame of the second data to error detection using CRC code words therein.

A step S209 following the step S208 decides whether or not at least one error of the second data is detected during the error detection by the step S208. If at least one error of the second data is detected during the error detection, the program advances from the step S209 to the step S211. Otherwise, the program advances from the step S209 to a step S210.

The step S210 outputs the current frame of the second data to a voice decoder 38 (see FIG. 5). Thus, in this case, audio information represented by the current frame of the second data is converted into sound by a loudspeaker 40 (see FIG. 5).

The step S211 generates a current frame of new data by interpolation using the immediately-preceding frame of the second data. The step S211 outputs the current frame of new data to the voice decoder 38 (see FIG. 5). Thus, in this case, audio information represented by the immediately-preceding frame of the second data is converted into sound by the loudspeaker 40 (see FIG. 5) instead of audio information represented by the current frame of the second data.

Alternatively, the step S211 may generate a current frame of muting data and output the current frame of the muting data to the voice decoder 38 (see FIG. 5). Thus, in this case, the loudspeaker 40 (see FIG. 5) is muted in response to the muting data.

The steps S210 and S211 are followed by a subsequent step (not shown).

The steps S206, S209, and S211 cooperate to effectively prevent audio noise from being generated by the loudspeaker 40 (see FIG. 5) due to errors in the received data.

Third Embodiment

Figure 7:
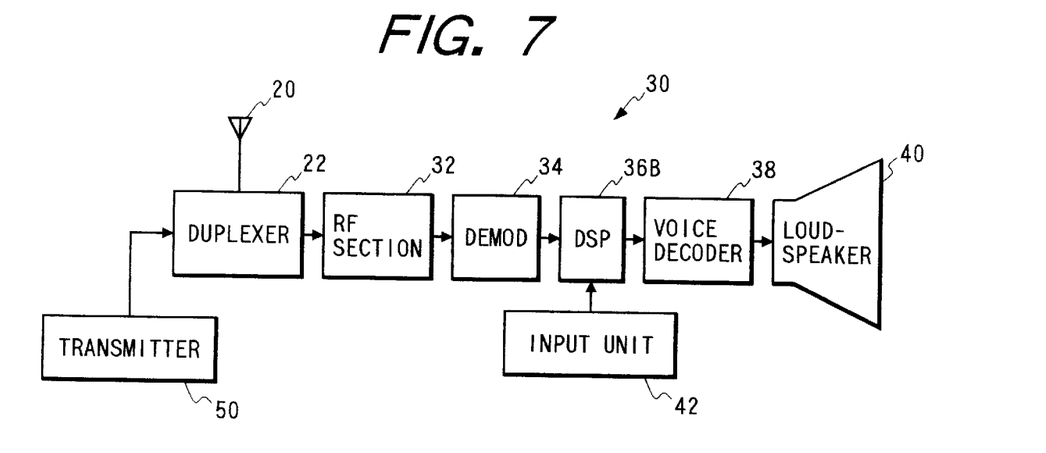
FIG. 7 is a block diagram of a mobile station according to a third embodiment of this invention.

A third embodiment of this invention is similar to the first embodiment thereof except for design changes indicated later. FIG. 7 shows a mobile station in the third embodiment of this invention. The mobile station in FIG. 7 includes a digital signal processor (DSP) 36B instead of the digital signal processor 36 in FIG. 3.

The mobile station in FIG. 7 includes an input unit 42 connected to the digital signal processor 36B. The input unit 42 has manually-operated keys or switches. The input unit 42 generates a control signal in response to operation of the keys or switches. The input unit 42 outputs the control signal to the digital signal processor 36B.

Figure 8:
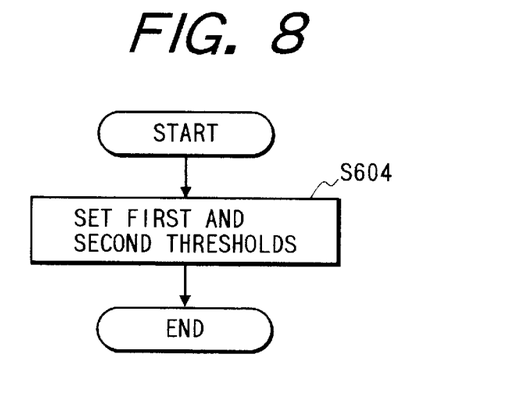
FIG. 8 is a flowchart of a first segment of a control program for a digital signal processor in FIG. 7.

FIG. 8 is a flowchart of a first segment of a control program for the digital signal processor 36B which is started in response to operation of the input unit 42.

With reference to FIG. 8, the first segment of the control program has a step S604 which sets or updates first and second threshold values in response to the control signal fed from the input unit 42 (see FIG. 7). Thus, the first and second threshold values can be adjusted in accordance with user's requirements.

Figure 9:
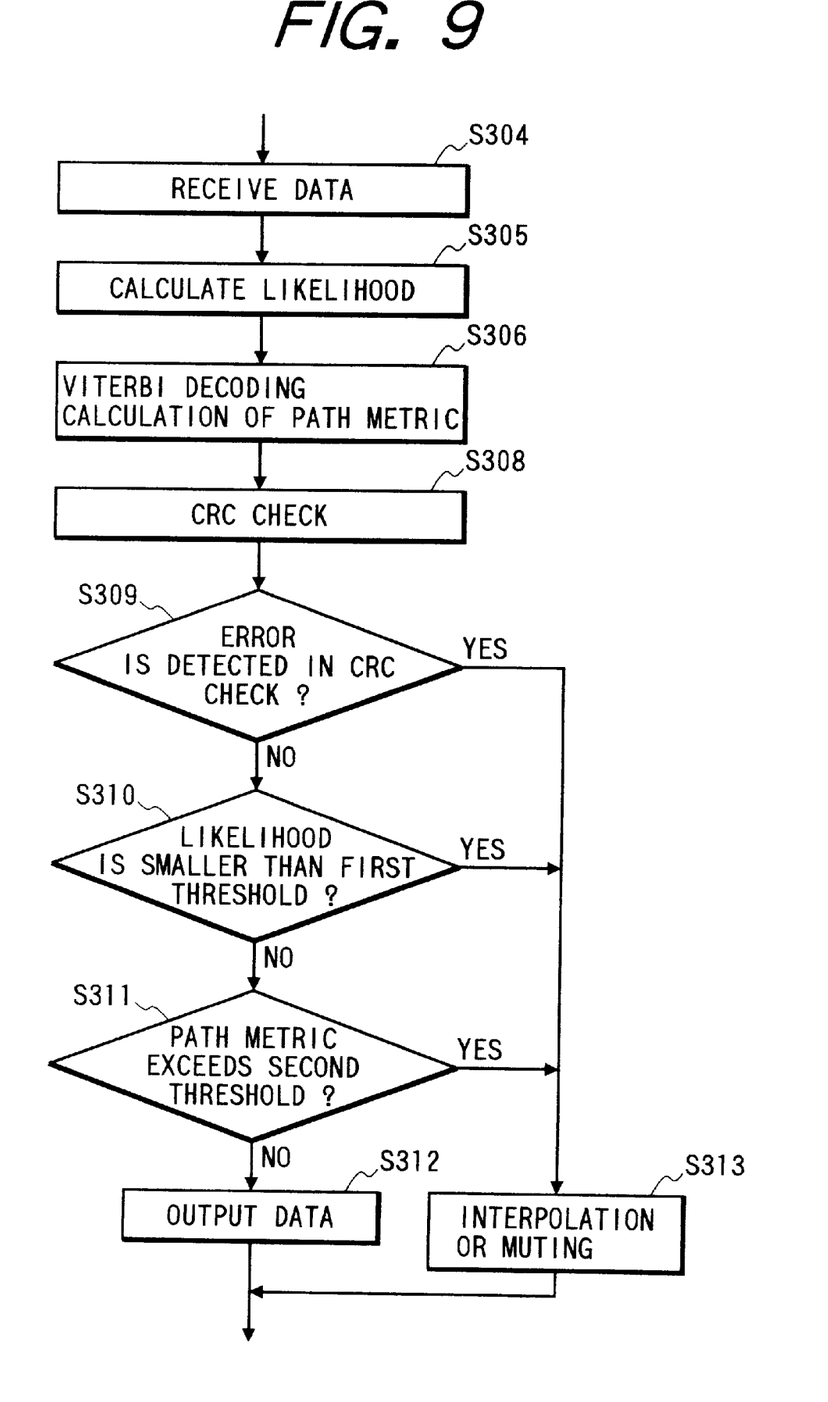
FIG. 9 is a flowchart of a second segment of the control program for the digital signal processor in FIG. 7.

FIG. 9 is a flowchart of a second segment of the control program for the digital signal processor 36B which is executed for every frame.

With reference to FIG. 9, a first step S304 in the second program segment receives a current frame of data, that is, a current frame of a digital audio signal, from a demodulator 34 (see FIG. 7).

A step S305 following the step S304 calculates a likelihood of the current frame of the received data in a know way.

A step S306 subsequent to the step S305 subjects the current frame of the received data to Viterbi decoding which is opposite to convolutional encoding in a transmitter. The Viterbi decoding has an error correcting function by which an error or errors in the frame of the received data can be corrected. Thus, the step S306 decodes the received data into second data. During the Viterbi decoding, path metrics are calculated, and the smallest path metric is selected from among the calculated path metrics. The second data is determined by the smallest path metric.

A step S308 following the step S306 subjects a current frame of the second data to error detection using CRC code words therein.

A step S309 subsequent to the step S308 decides whether or not at least one error of the second data is detected during the error detection by the step S308. If at least one error of the second data is detected during the error detection, the program advances from the step S309 to a step S313. Otherwise, the program advances from the step S309 to a step S310.

The step S310 decides whether or not the likelihood calculated by the step S305 is smaller than the first threshold value which has been given by the step S604 in FIG. 8. When the calculated likelihood is smaller than the first threshold value, the program advances from the step S310 to the step S313. Otherwise, the program advances from the step S310 to a step S311. It should be noted that the received data is more erroneous as the likelihood decreases.

The step S311 decides whether or not the smallest path metric available in the step S306 exceeds the second threshold value which has been given by the step S604 in FIG. 8. When the smallest path metric exceeds the second threshold value, the program advances from the step S311 to the step S313. Otherwise, the program advances from the step S311 to a step S312. It should be noted that the received data is more erroneous as the smallest path metric increases.

The step S312 outputs the current frame of the second data to a voice decoder 38 (see FIG. 7). Thus, in this case, audio information represented by the current frame of the second data is converted into sound by a loudspeaker 40 (see FIG. 7).

The step S313 generates a current frame of new data by interpolation using the immediately-preceding frame of the second data. The step S313 outputs the current frame of the new data to the voice decoder 38 (see FIG. 7). Thus, in this case, audio information represented by the immediately-preceding frame of the second data is converted into sound by the loudspeaker 40 (see FIG. 7) instead of audio information represented by the current frame of the second data.

Alternatively, the step S313 may generate a current frame of muting data and output the current frame of the muting data to the voice decoder 38 (see FIG. 7). Thus, in this case, the loudspeaker 40 (see FIG. 7) is muted in response to the muting data.

The steps S312 and S313 are followed by a subsequent step (not shown).

The steps S309, S310, S311, and S313 cooperate to effectively prevent audio noise from being generated by the loudspeaker 40 (see FIG. 7) due to errors in the received data.

It should be noted that the first and second threshold values given by the step S604 in FIG. 8 may be replaced by first and second predetermined threshold values respectively. In this case, the input unit 42 (see FIG. 7) can be omitted.

Fourth Embodiment

Figure 10:
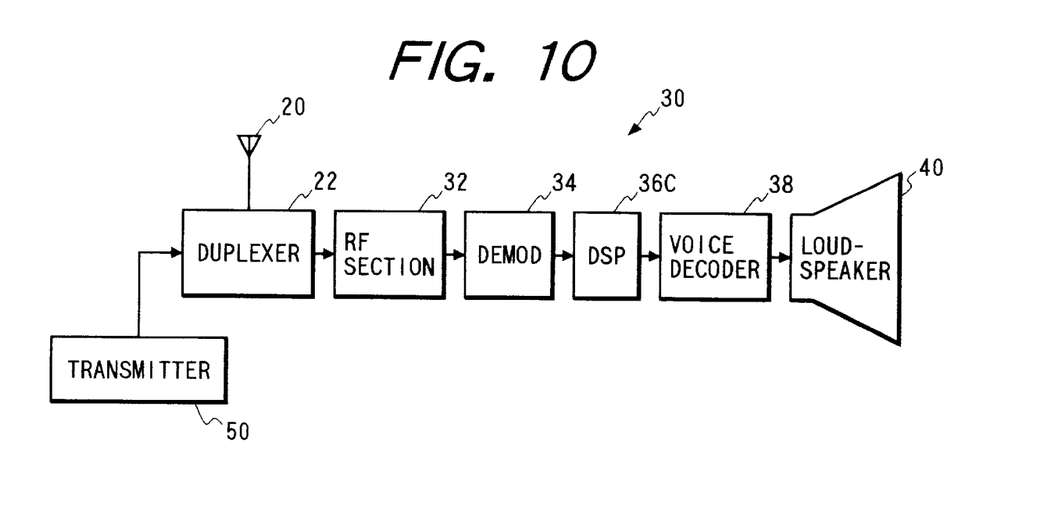
FIG. 10 is a block diagram of a mobile station according to a fourth embodiment of this invention.

A fourth embodiment of this invention is similar to the first embodiment thereof except for design changes indicated later. FIG. 10 shows a mobile station in the fourth embodiment of this invention. The mobile station in FIG. 10 includes a digital signal processor (DSP) 36C instead of the digital signal processor 36 in FIG. 3.

Figure 11:
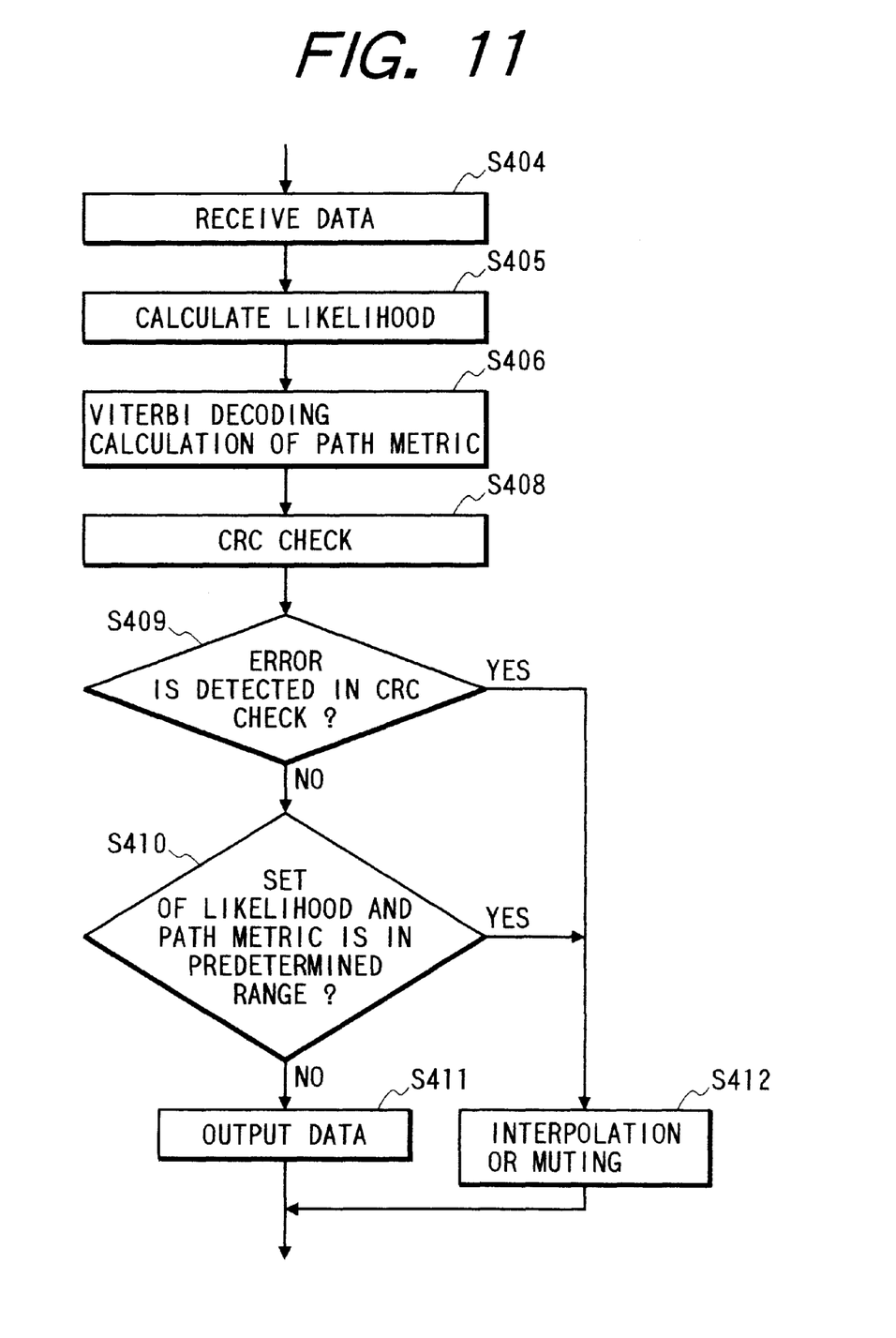
FIG. 11 is a flowchart of a segment of a control program for a digital signal processor in FIG. 10.

FIG. 11 is a flowchart of a segment of a control program for the digital signal processor 36C which is executed for every frame.

With reference to FIG. 11, a first step S404 in the program segment receives a current frame of data, that is, a current frame of a digital audio signal, from a demodulator 34 (see FIG. 10).

A step S405 following the step S404 calculates a likelihood of the current frame of the received data in a know way.

A step S406 subsequent to the step S405 subjects the current frame of the received data to Viterbi decoding which is opposite to convolutional encoding in a transmitter. The Viterbi decoding has an error correcting function by which an error or errors in the frame of the received data can be corrected. Thus, the step S406 decodes the received data into second data. During the Viterbi decoding, path metrics are calculated, and the smallest path metric is selected from among the calculated path metrics. The second data is determined by the smallest path metric.

A step S408 following the step S406 subjects a current frame of the second data to error detection using CRC code words therein.

A step S409 subsequent to the step S408 decides whether or not at least one error of the second data is detected during the error detection by the step S408. If at least one error of the second data is detected during the error detection, the program advances from the step S409 to a step S412. Otherwise, the program advances from the step S409 to a step S410.

The step S410 decides whether or not a set of the likelihood calculated by the step S405 and the smallest path metric available in the step S406 is in a predetermined range within a 2-dimensional likelihood/path-metric plane. When the set of the likelihood and the path metric is in the predetermined range, the program advances from the step S410 to the step S412. Otherwise, the program advances from the step S410 to a step S411. Preferably, the predetermined range is chosen to correspond to the presence of an error or errors in the received data.

The step S411 outputs the current frame of the second data to a voice decoder 38 (see FIG. 10). Thus, in this case, audio information represented by the current frame of the second data is converted into sound by a loudspeaker 40 (see FIG. 10).

The step S412 generates a current frame of new data by interpolation using the immediately-preceding frame of the second data. The step S412 outputs the current frame of the new data to the voice decoder 38 (see FIG. 10). Thus, in this case, audio information represented by the immediately-preceding frame of the second data is converted into sound by the loudspeaker 40 (see FIG. 10) instead of audio information represented by the current frame of the second data.

Alternatively, the step S412 may generate a current frame of muting data and output the current frame of the muting data to the voice decoder 38 (see FIG. 10). Thus, in this case, the loudspeaker 40 (see FIG. 10) is muted in response to the muting data.

The steps S411 and S412 are followed by a subsequent step (not shown).

The steps S409, S410, and S412 cooperate to effectively prevent audio noise from being generated by the loudspeaker 40 (see FIG. 10) due to errors in the received data.

Figure 12:
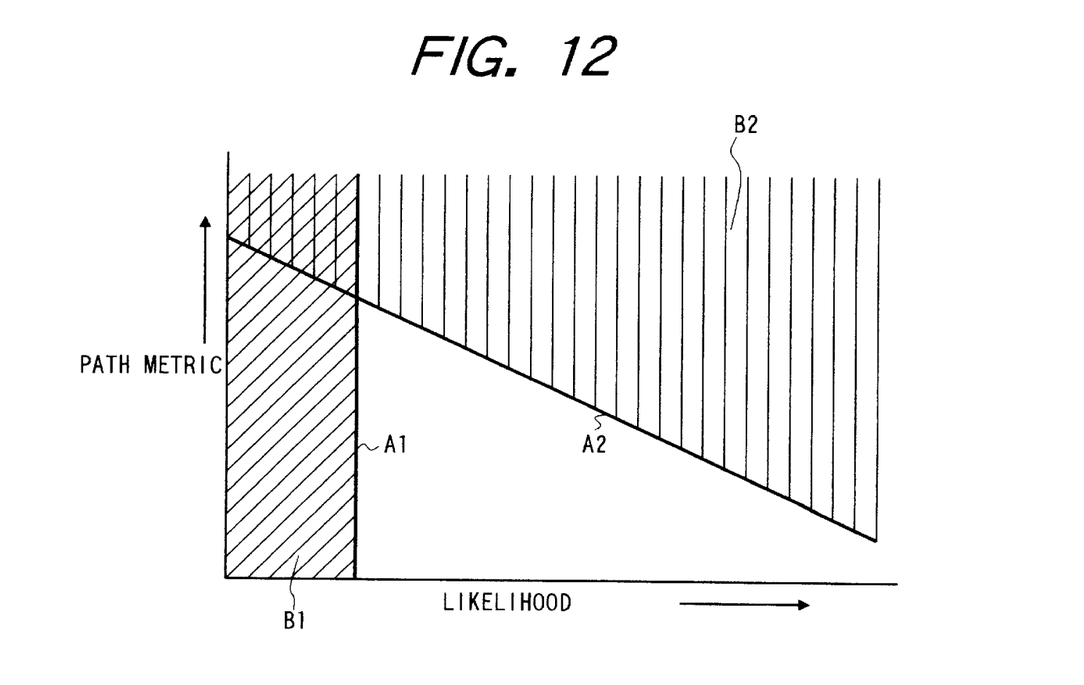
FIG. 12 is a diagram of a 2-dimensional likelihood/path-metric plane used by a step in FIG. 11.

As shown in FIG. 12, the 2-dimensional likelihood/path-metric plane used by the step S410 in FIG. 11 has an abscissa and an ordinate corresponding to likelihood and path metric respectively. An area B1 extends leftward of a vertical straight line A1 defined by a predetermined likelihood. An area B2 extends above an inclined straight line A2 which corresponds to a predetermined likelihood/path-metric relation such that a likelihood on a point of the line A2 increases as a path metric on the same point of the line A2 decreases. The areas B1 and B2 compose the predetermined range used by the step S410 in FIG. 11.

What is claimed is:

1. A method comprising the steps of:
   a) subjecting received data to Viterbi decoding to correct an error in the received data and thereby decoding the received data into second data, and calculating a path metric to determine the second data during the Viterbi decoding;

b) deciding whether or not at least one error is present in the second data by referring to a cyclic redundancy check code in the second data;

c) discarding the second data when the step b) decides that at least one error is present in the second data;

d) deciding whether or not the path metric calculated by the step a) exceeds a threshold value;

e) discarding the second data when the step d) decides that the path metric exceeds the threshold value; and f) converting the second data into sound when the step b) decides that at least one error is not present in the second data and the step d) decides that the path metric does not exceed the threshold value.

2. A method as recited in claim 1, further comprising the steps of:

g) calculating a likelihood of the received data;

h) deciding whether or not the likelihood calculated by the step g) is smaller than a reference value; and i) discarding the second data when the step h) decides that the likelihood is smaller than the reference value;

wherein the step f) comprises converting the second data into sound when the step b) decides that at least one error is not present in the second data, the step d) decides that the path metric does not exceed the threshold value, and the step h) decides that the likelihood is not smaller than the reference value.

3. A method as recited in claim 2, further comprising the steps of:

j) adjusting the threshold value; and k) adjusting the reference value.

4. A method as recited in claim 2, wherein the threshold value and the reference value comprise a predetermined threshold value and a predetermined reference value respectively.

5. A method comprising the steps of:

a) calculating a likelihood of received data;

b) deciding whether or not the likelihood calculated by the step a) is smaller than a reference value;

c) discarding the received data when the step b) decides that the likelihood is smaller than the reference value;

d) deciding whether or not at least one error is present in the received data by referring to a cyclic redundancy check code in the received data;

e) discarding the received data when the step d) decides that at least one error is present in the received data; and f) converting the received data into sound when the step b) decides that the likelihood is not smaller than the reference value and the step d) decides that at least one error is not present in the received data.

6. A method comprising the steps of:

a) calculating a likelihood of received data;

b) subjecting the received data to Viterbi decoding to correct an error in the received data and thereby decoding the received data into second data, and calculating a path metric to determine the second data during the Viterbi decoding;

c) deciding whether or not at least one error is present in the second data by referring to a cyclic redundancy check code in the second data;

d) discarding the second data when the step c) decides that at least one error is present in the second data;

e) deciding whether or not a set of the likelihood calculated by the step a) and the path metric calculated by the step b) is in a predetermined range within a 2-dimensional likelihood/path-metric plane;

f) discarding the second data when the step e) decides that the set of the likelihood and the path metric is in the predetermined range; and g) converting the second data into sound when the step c) decides that at least one error is not present in the second data and the step e) decides that the set of the likelihood and the path metric is not in the predetermined range.

7. An apparatus comprising:

first means for subjecting received data to Viterbi decoding to correct an error in the received data and thereby decoding the received data into second data, and for calculating a path metric to determine the second data during the Viterbi decoding;

second means for deciding whether or not at least one error is present in the second data by referring to a cyclic redundancy check code in the second data;

third means for discarding the second data when the second means decides that at least one error is present in the second data;

fourth means for deciding whether or not the path metric calculated by the first means exceeds a threshold value;

fifth means for discarding the second data when the fourth means decides that the path metric exceeds the threshold value; and sixth means for converting the second data into sound when the second means decides that at least one error is not present in the second data and the fourth means decides that the path metric does not exceed the threshold value.

8. An apparatus as recited in claim 7, further comprising:

seventh means for calculating a likelihood of the received data;

eighth means for deciding whether or not the likelihood calculated by the seventh means is smaller than a reference value;

and ninth means for discarding the second data when the eighth means decides that the likelihood is smaller than the reference value;

wherein the sixth means comprises means for converting the second data into sound when the second means decides that at least one error is not present in the second data, the fourth means decides that the path metric does not exceed the threshold value, and the eighth means decides that the likelihood is not smaller than the reference value.

9. An apparatus as recited in claim 8, further comprising:

tenth means for adjusting the threshold value; and eleventh means for adjusting the reference value.

10. An apparatus as recited in claim 8, wherein the threshold value and the reference value comprise a predetermined threshold value and a predetermined reference value respectively.

11. An apparatus comprising:

first means for calculating a likelihood of received data;

second means for deciding whether or not the likelihood calculated by the first means is smaller than a reference value;

third means for discarding the received data when the second means decides that the likelihood is smaller than the reference value;

fourth means for deciding whether or not at least one error is present in the received data by referring to a cyclic redundancy check code in the received data;

fifth means for discarding the received data when the fourth means decides that at least one error is present in the received data; and sixth means for converting the received data into sound when the second means decides that the likelihood is not smaller than the reference value and the fourth means decides that at least one error is not present in the received data.

12. An apparatus comprising:

first means for calculating a likelihood of received data;

second means for subjecting the received data to Viterbi decoding to correct an error in the received data and thereby decoding the received data into second data, and for calculating a path metric to determine the second data during the Viterbi decoding;

third means for deciding whether or not at least one error is present in the second data by referring to a cyclic redundancy check code in the second data;

fourth means for discarding the second data when the third means decides that at least one error is present in the second data;

fifth means for deciding whether or not a set of the likelihood calculated by the first means and the path metric calculated by the second means is in a predetermined range within a 2-dimensional likelihood/path-metric plane;

sixth means for discarding the second data when the fifth means decides that the set of the likelihood and the path metric is in the predetermined range; and seventh means for converting the second data into sound when the third means decides that at least one error is not present in the second data and the fifth means decides that the set of the likelihood and the path metric is not in the predetermined range.

* * * * *